United States Patent
Chen

(10) Patent No.: US 7,547,941 B2
(45) Date of Patent: Jun. 16, 2009

(54) NAND NON-VOLATILE TWO-BIT MEMORY AND FABRICATION METHOD

(75) Inventor: Chung-Zen Chen, Hsinchu (TW)

(73) Assignee: Elite Semiconductor Memory Technology, Inc. (TW)

( * ) Notice: Subject to any disclaimer, the term of this patent is extended or adjusted under 35 U.S.C. 154(b) by 363 days.

(21) Appl. No.: 11/417,602

(22) Filed: May 4, 2006

(65) Prior Publication Data

US 2007/0257307 A1    Nov. 8, 2007

(51) Int. Cl.
*H01L 29/778* (2006.01)
*H01L 29/76* (2006.01)

(52) U.S. Cl. ............... 257/320; 257/315; 257/316; 257/319; 257/E21.68; 257/E21.69; 438/257; 438/278

(58) Field of Classification Search ............ 257/315, 257/316, 319, 320; 438/257, 258
See application file for complete search history.

(56) References Cited

U.S. PATENT DOCUMENTS

| | | | |
|---|---|---|---|
| 4,959,812 A | 9/1990 | Momodomi et al. | |
| 5,614,747 A * | 3/1997 | Ahn et al. | 257/316 |
| 6,091,104 A | 7/2000 | Chen | |
| 6,504,207 B1 * | 1/2003 | Chen et al. | 257/319 |
| 6,580,120 B2 | 6/2003 | Haspeslagh | |
| 6,885,586 B2 | 4/2005 | Chen et al. | |
| 6,936,888 B2 * | 8/2005 | Katayama et al. | 257/320 |

* cited by examiner

*Primary Examiner*—Dao H Nguyen
(74) *Attorney, Agent, or Firm*—Hogan & Hartson LLP

(57) ABSTRACT

A NAND non-volatile two-bit memory cell comprises a cell stack and two select stacks disposed on an active area of a substrate. Each select stack is respectively disposed on a side of the cell stack with a sidewall between the cell stack and a respective select stack. The cell stack has four components: a first dielectric layer disposed over the substrate; a charge accumulation layer capable of holding charge in a portion thereof to store information and disposed over the first dielectric layer; a second dielectric layer disposed over the charge accumulation layer; and a control gate disposed over the second dielectric layer. The select stack has two components: a third dielectric layer disposed over the substrate and a select gate, capable of inverting an underneath channel region to function as a source or a drain of the memory cell, disposed over the third dielectric layer.

16 Claims, 12 Drawing Sheets

|  | Erase | | Program | | Read |
| --- | --- | --- | --- | --- | --- |
|  | BL0 | BL1 | DATA "0" | DATA "1" |  |
| BL0 | Floating | Floating | 0V | 0V | 0V |
| BL1 | Floating | Floating | 4.5V | 0V | 1.5V |
| SEL0 | 0V | 0V | 7V | 7V | 4.5V |
| SEL1 | 0V | 0V | 0V | 0V | 0V |
| SG0 | VE/0V | VE/0V | 7V | 7V | 4.5V |
| CG0 | 0V/-VE | 0V/-VE | 7V | 7V | 4.5V |
| SG1 | VE/0V | VE/0V | 1.5V | 1.5V | 4.5V |
| CG1 | 0V/-VE | 0V/-VE | 9V | 9V | 1.5V |
| SG2 | VE/0V | VE/0V | 7V | 7V | 4.5V |
| CG2 | 0V/-VE | 0V/-VE | 7V | 7V | 4.5V |
|  |  |  |  |  |  |
| CGn | 0V/-VE | 0V/-VE | 7V | 7V | 4.5V |
| SEL0 | 0V | 0V | 7V | 7V | 4.5V |
| SEL1 | 0V | 0V | 0V | 0V | 0V |
| VPW | 12V/VPWE | 12V/VPWE | 0V | 0V | 0V |
| The bias can be: VE=5V, VPWE=7V. | | | | | |

FIG. 4

Cell string 0

Cell string 1

NAND NON-VOLATILE TWO-BIT MEMORY AND FABRICATION METHOD

BACKGROUND

1. Field of the Invention

The present invention relates to semiconductor memory devices. More specifically, the present invention relates to a NAND non-volatile two-bit flash memory.

2. Description of the Related Art

A non-volatile semiconductor memory device can retain information even when the device is left without power for indefinite periods of time. According to its function, non-volatile memory devices can generally be categorized into read only memory (ROM), programmable read only memory (PROM), electrical programmable read only memory (EPROM), electrical erasable programmable read only memory (EEPROM) and EEPROM flash memory. Because of its capability of faster erasure and programming in blocks, the EEPROM flash memory has been widely used for high volume data storage in devices such as memory cards, memory sticks, personal digital assistants (PDA) and MP3 players.

EEPROM flash memories can be roughly classified into NAND-type and NOR-type. A NAND flash memory has a plurality of memory cells serially connected as a string to share sources and drains with the neighboring cells. A NOR flash memory has a plurality of memory cells connected in parallel, each of which has its own source and drain. Due to this difference, a NAND flash memory has a higher cell density than a NOR flash memory.

U.S. Pat. No. 6,885,586 describes a self-aligned split-gate NAND flash memory. Each memory cell has a control gate and a floating gate which are stacked and self-aligned with each other, and a split gate interposed between stacked gates for erasure. The floating gates are fabricated from a conductive material such as polysilicon or amorphous silicon with rounded side edges to improve erasure and programming performance. In the erasure operation, an enhanced electric filed resulted from the rounded curvature of floating gates facilitate electrons to emit from the rounded side edge of the floating gate to the corresponding split gate by Fowler-Nordheim tunneling effect. In the programming operation, electrons are injected from the channel region into the floating gate by hot electron injection or Fowler-Nordheim tunneling effect. A memory cell can store one-bit information.

The demand is increasing for large volume data storage with low cost. One approach to increase the density of data storage is for a memory cell to be capable of storing two-bit information.

SUMMARY OF THE PREFERRED EMBODIMENTS

A NAND non-volatile two-bit memory cell comprises a cell stack and two select stacks disposed on an active area of a substrate. Each select stack is respectively disposed on a side of the cell stack with a sidewall between the cell stack and a respective select stack. The cell stack has four components: a first dielectric layer disposed over the substrate; a charge accumulation layer capable of holding charge in a portion thereof to store information and disposed over the first dielectric layer; a second dielectric layer disposed over the charge accumulation layer; and a control gate disposed over the second dielectric layer. The select stack has two components: a third dielectric layer disposed over the substrate and a select gate, capable of inverting an underneath channel region to function as a source or a drain of the memory cell, disposed over the third dielectric layer.

BRIEF DESCRIPTION OF THE DRAWINGS

A more complete understanding of the present invention can be obtained by reference to the detailed description in conjunction with the accompanying drawings, which form part of the disclosure. These drawings depict only a typical embodiment of the invention and are not intended to limit its scope.

FIG. 4 is a table of exemplary voltages applied to bit lines, word lines, control gates, select gates and others for erasing, writing and reading of the memory cell arrays.

DETAILED DESCRIPTION OF THE PREFERRED EMBODIMENTS

A NAND non-volatile two-bit memory cell has a charge accumulation layer which can hold charge on a portion thereof. Accordingly, each side of the charge accumulation layer can store one-bit of information so that a memory cell can store two bits of information. Each memory cell has a cell stack comprising a control gate and a charge accumulation layer, and two select stacks comprising select gates. Each select stack is disposed adjacent to one side of the cell stack with a sidewall between the cell stack and the select stack. The select stacks can invert channel regions underneath the select stacks to function as a source and a drain of the memory cell when voltages applied to select gates are higher than their threshold voltages. By controlling the applied voltages, the select gates can manage the source side injection of electrons during a programming operation.

Figure 1:
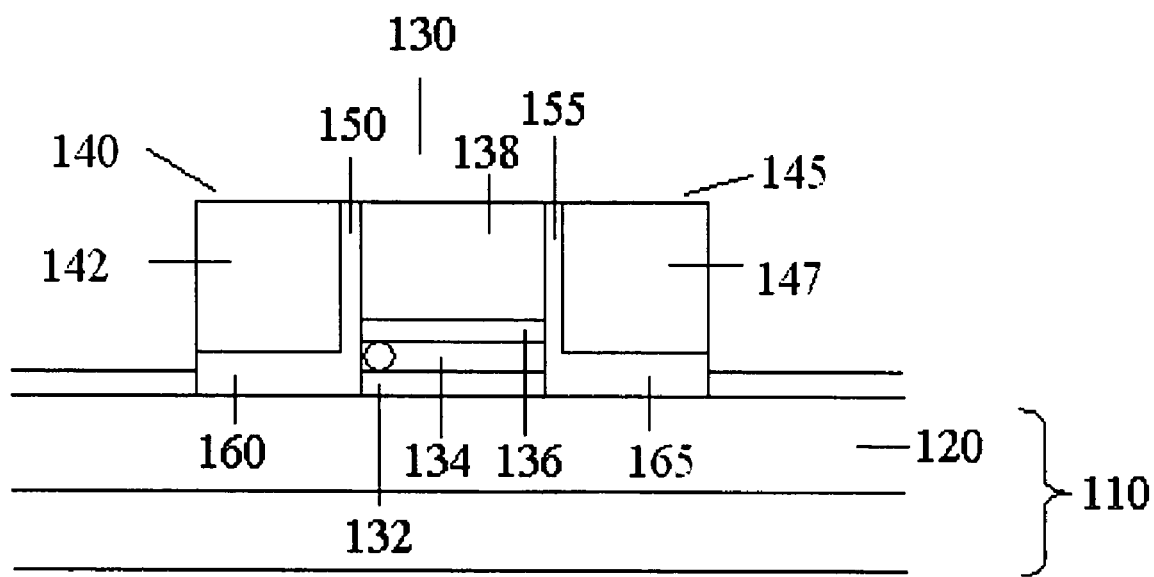
FIG. 1 is a cross sectional diagram of an exemplary embodiment of a NAND non-volatile two-bit memory cell.

As shown in FIG. 1, a NAND non-volatile two-bit memory cell 100 has a cell stack 130 and two select stacks 140, 145 disposed on an active area 120 of a substrate 110. The select stacks 140, 145 are respectively disposed on one side of the cell stack 130 with sidewalls 150, 155 between the cell stack 130 and the select stacks 140, 145. The cell stack 130 includes a first dielectric layer 132 disposed over the substrate 110, a charge accumulation layer 134 capable of holding charges in a portion thereof disposed over the first dielectric layer 132, a second dielectric layer 136 disposed over the charge accumulation layer 134 and a control gate 138 disposed over the second dielectric layer 136. Because each side of the charge accumulation layer 134 can separately retain charges, a memory cell 100 can store two bits of information (Bit 0 and Bit 1).

Each of the select stacks 140, 145 includes a third dielectric layer 160, 165 disposed over the substrate 110 and a select gate 142, 147 disposed over a third dielectric layer 160, 165. When the select gates 142, 147 are applied with a voltage higher than their threshold voltages, the channel regions underneath select gates are inverted to function as a source or a drain of the memory cell, depending on which portion of the charge accumulation layer is programming. When programming the right side portion of the charge accumulation layer (Bit 0), the inverted channel region underneath the right side select stack 145 functions as a source of the memory cell. When programming the left side portion of the charge accumulation layer (Bit 1), the inverted channel region underneath the left side select stack 142 functions as a source of the memory cell. By controlling the applied voltage, the select gates 142, 147 are capable of managing source side injection of electrons from a source region into the charge accumulation layer 134 during a programming operation.

In one embodiment, the substrate 110 is formed by semiconductor material such as silicon. Within the substrate 110, the active area 120 is formed by a P-well layer. Above the active area, the first dielectric layer 132 is a thermal oxide layer with a thickness of about 30-50 angstroms to provide insulation function. Above the first dielectric layer, the charge accumulation layer 134 is a silicon nitride layer with a thickness of about 60-80 angstroms to provide charge retention mechanism for memory cell programming. Above the charge accumulation layer, the second dielectric layer 136 is a silicon dioxide layer with a thickness of about 20-40 angstroms. Above the second dielectric layer, the control gate 138 is formed by polysilicon with a thickness of about 1000 angstroms. Adjacent to the control gate, the select gates 142, 147 are formed by polysilicon. Between the cell stack 130 and select stacks 140, 145, the sidewalls 150, 155 have two layers, including an inner layer made of silicon nitride disposed adjacent to the cell stack 130 and an outer layer made of silicon dioxide disposed adjacent to the select stacks 140, 145. The thickness of the sidewalls 150, 155 is about 180 angstroms. Between the select gate 142, 147 and the substrate 110, the third dielectric layer 160, 165 is a silicon dioxide layer with a thickness of about 140 angstroms.

Figure 2:
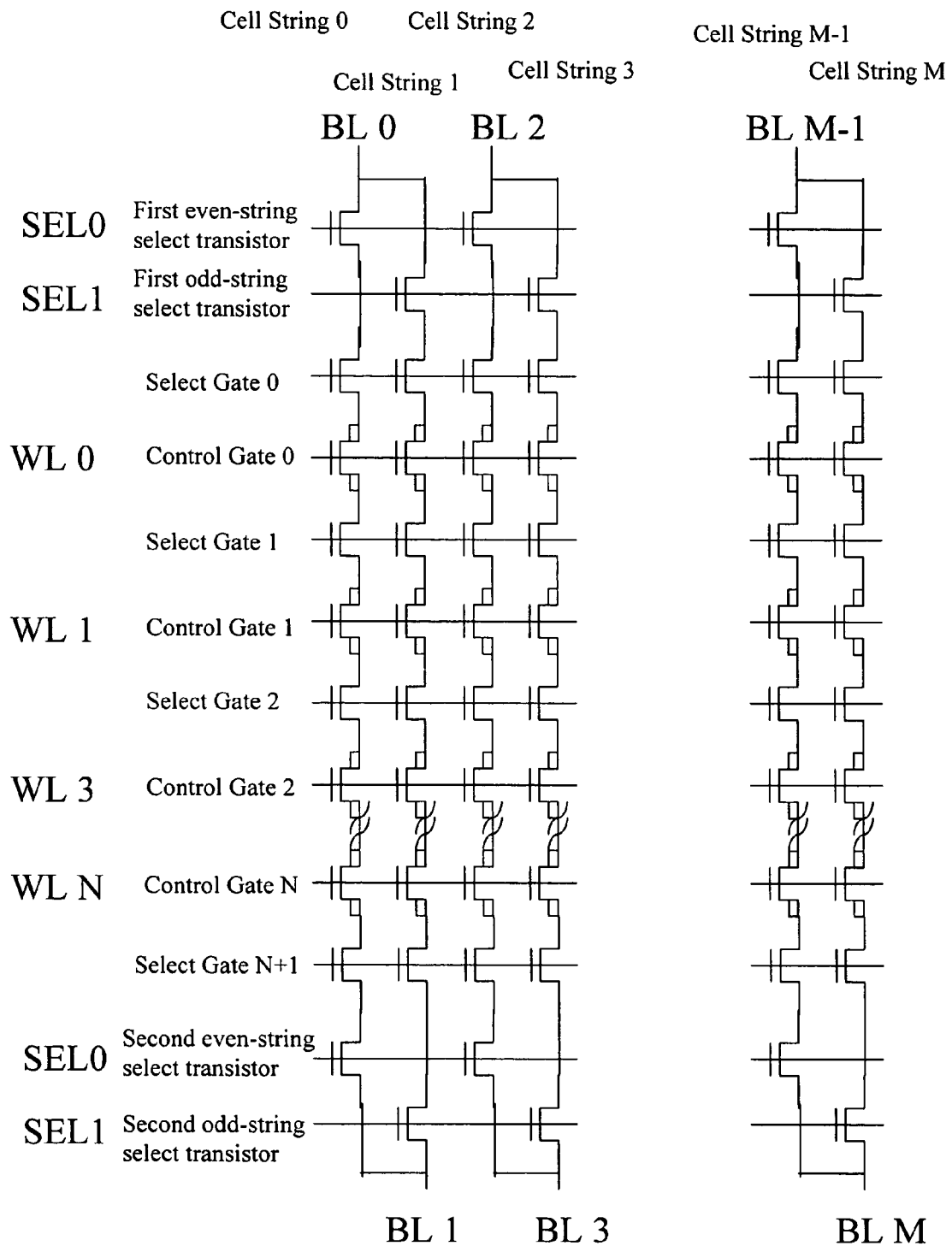
FIG. 2 is a schematic diagram of an exemplary embodiment of a NAND non-volatile two-bit memory cell array.
Figure 3A:
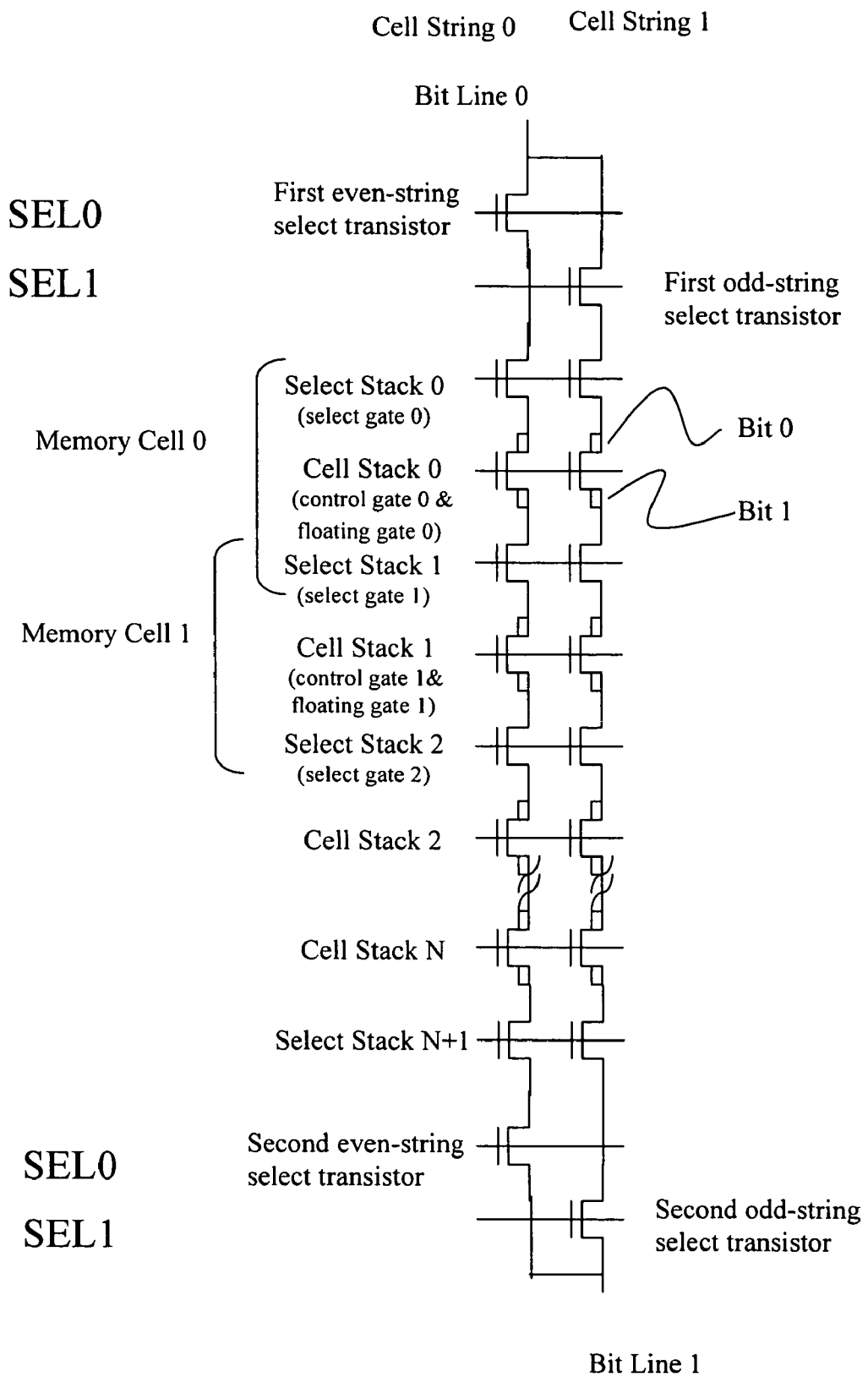
FIG. 3A is a schematic diagram of a two-string structure used to formed a NAND non-volatile two-bit memory cell array.

FIG. 2 demonstrates a NAND non-volatile two-bit memory cell array. A plurality of memory cells are arranged in rows and columns. Memory cells in the same row are connected in a series to form cell strings. To select a cell string for programming and reading, a select transistor is connected to each end of the cell strings. A plurality of memory cells in an even column forms an even cell string; a plurality of memory cells in an odd column forms an odd cell string. Two select transistors each of which is respectively connected to one end of the even cell string are even-string select transistors; two select transistors each of which is respectively connected to the odd cell string are odd-string select transistors. An even cell string, two even-string select transistors, an odd cell string, and two odd-string select transistors form a two-string structure detailed in FIG. 3A. A first even-string select transistor and a first odd-string select transistor are disposed at one end (upper end) of the two-string structure to connect with an even bit line. A second even-string select transistor and a second odd-string select transistor are disposed at the other end (lower end) of the two-string structure to connect with an odd bit line.

In FIG. 2, the array has M memory cell strings arranged in (M+1)/2 cell string pairs. Each cell string pair has an even cell string and an odd cell string. Each cell string has N memory cells connected in a series with N cell stacks and N+1 select stacks alternately disposed on both sides of the cell stacks with a sidewall between the cell stack and the select stack. Because of this arrangement, a select stack disposed between two cell stacks is shared by two adjacent memory cells. For example, shown in FIG. 3A, select stack 1 is shared by memory cell 0 and memory cell 1. Specifically, memory cell 0 includes select stack 0, cell stack 0 and select stack 1; memory cell 1 includes select stack 1, cell stack 1 and select stack 2.

For programming, a bit line pair, including an even bit line and an odd bit line, is connected to a two-string structure. The even bit line is connected to one end of the two-string structure through the first even-string select transistor and the first odd-string select transistor; the odd bit line is connected to an opposite end of the two-string structure through the second even-string select transistor and odd-string select transistor. For example, bit line 0 (BL 0) is connected both to the upper end of cell string 0 through the first even-string select transistor and to the upper end of cell String 1 through the first odd-string select transistor. Bit line 1 (BL 1) is connected both to the lower end of cell string 0 through the second even-string select transistor and to the lower end of cell string 1 through the second odd-string select transistor. Bit line 0 and bit line 1 provide voltages to cell string 0 and cell string 1 for programming. However, only one of cell string 0 and cell string 1 is selected for programming by turning on either even-string select transistors or odd-string select transistors. The array, therefore, can be divided into two pages, page 0 formed by even cell strings (strings 0, 2, . . . , M−1) and page 1 formed by odd cell strings (Strings 1, 3, . . . , M).

Word lines respectively connect to control gates and select gates of each cell string. Select line 0 (SEL 0) connects to the even-string select transistors of even cell strings. When select line 0 is activated, even-string select transistors are turned on and page 0 formed by even cell strings is selected. Select line 1 (SEL 1) connects to the odd-string select transistors of odd cell strings. When select line 1 is activated, odd-string select transistors are turned on and page 1 formed by odd cell strings is selected.

Figure 3B:
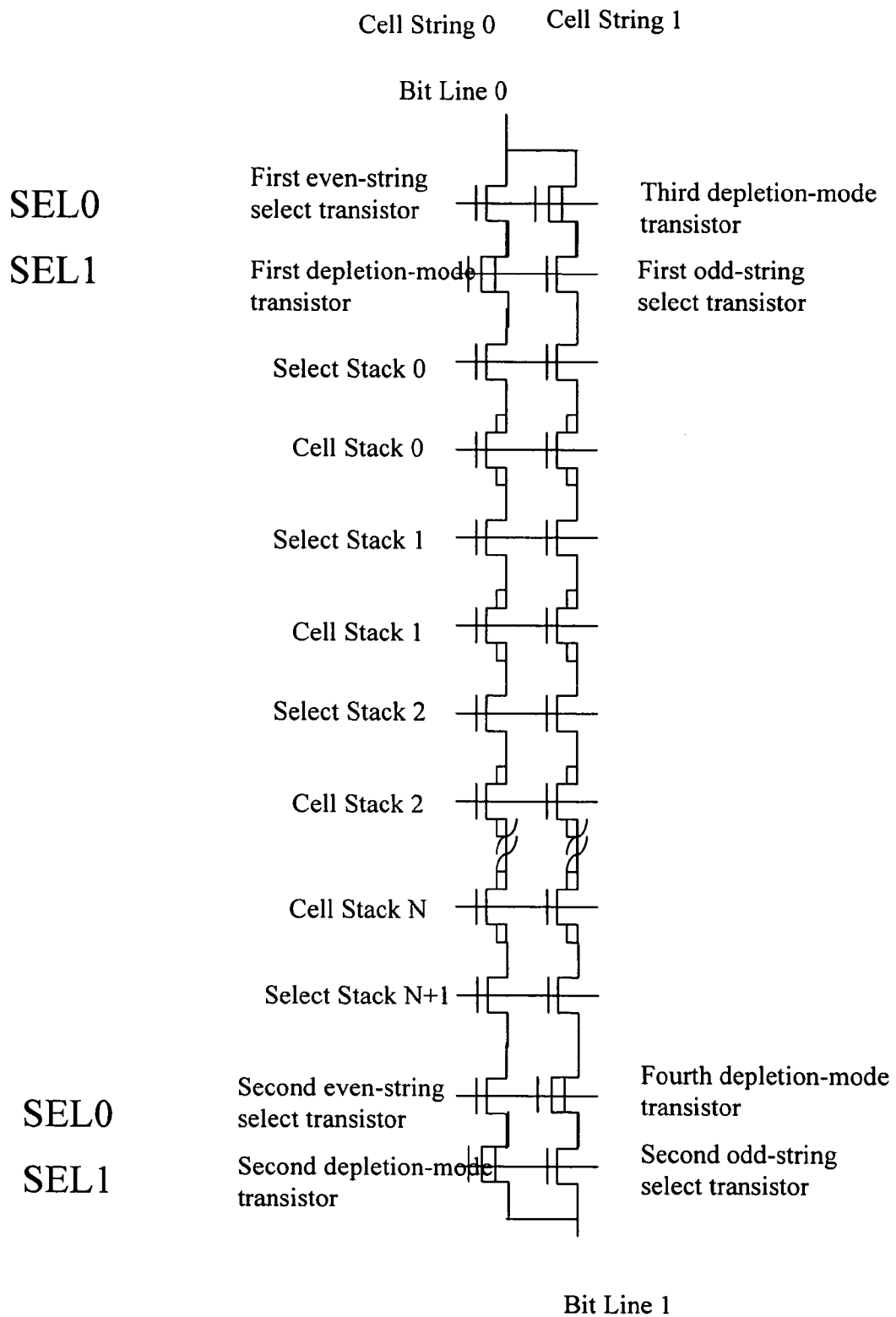
FIG. 3B is a schematic diagram of another embodiment of a two-string structure.

FIG. 3B shows another embodiment of a two-string structure with four depletion mode transistors to form a NAND non-volatile two-bit memory cell array. A first depletion mode transistor is disposed vertically between the first even-string select transistor and select gate 0 and is disposed horizontally on the same row line as the first odd-string select transistor. A second depletion mode transistor is disposed vertically between the second even-string select transistor and bit line 1 and is disposed horizontally on the same row line as the second odd-string select transistor. A third depletion mode transistor is disposed vertically between the first odd-string select transistor and bit line 0 and is disposed horizontally on the same row line as the first even-string select transistor. A fourth depletion mode transistor is disposed vertically between the select gate N+1 and the second odd-string select transistor and is disposed horizontally on the same row line as the second even-string select transistor. The depletion-mode transistors can facilitate the fabrication process of the memory cell arrays. Nonetheless, because they are always conductive, the depletion-mode transistors basically do not effect the memory operation.

FIG. 4 is a table demonstrating exemplary voltages applied to bit lines, word lines, control gates, select gates and others for erasing, writing and reading of the memory cell array. In an erasing operation, an electric field is established by a voltage difference between the control gate and the P-well layer of the substrate to discharge electrons from the charge accumulation layer to the P-well layer based on the Fowler-Nordheim tunneling effect. The word lines connected to control gates are set to a low voltage, such as 0 volt, and the P-well layer of the substrate is set to a high voltage, such as 12 volts. The gates of even-string select transistors and odd-string select transistors are set to a low voltage, such as 0 volt, to electrically disconnect memory cells from the bit lines. To avoid the gate oxide damage caused by breakthrough, the select gates are set to about 5 volts to reduce the voltage difference between the select gates and the P-well layer of the substrate. In another embodiment, the word lines connected to control gates are set to about −5 volts and the P-well layer of the substrate is set to about 7 volts to obtain a 12 volt voltage difference. The select gates are set to about 0 volt to avoid gate oxide damage.

To program a memory cell, the select gate at one side of the cell stack inverts its underneath channel region to function as a source; the other select gate at the other side of the cell stack inverts its underneath channel region to function as a drain. In a programming operation, electrons flowing from the source to the drain are injected into the source side of the charge accumulation layer and are retained at that side of the charge accumulation layer. Since the hot electrons for programming operation are generated at the source side, the process is called source side injection. For example, to program bit 0 of the memory cell 1 in the cell string 0, the gate of even-string select transistors are set to a high voltage, such as 7 volts and the gate of odd-string select transistors are set to a low voltage such as 0 volt to select cell string 0. Word line 1 connected to control gate 1 is set to about 9 volts to create a vertical electric field. Select gate 1 is set to about 1.5 volts which is high enough to turn on the channel region underneath select gate 1 and low enough to avoid a big current flow. All other control gates and select gates are set to about 7 volts. To write data "0" to bit 0 of memory cell 1, bit line 0 connected to the source is set to about 0 volt and bit line 1 connected to the drain is set to about 4.5 volts to create a lateral electric field. Hot electrons from the source are injected into the upper portion of the charge accumulation layer of memory cell 1.

To program bit 1 of memory cell 1 in cell string 0, word line 1 connected to control gate 1 is set to about 9 volts to create a vertical electric field. Select gate 2 is set to about 1.5 volts to control the current flow. To write data "0" to bit 1 of memory cell 1, bit line 0 connected to the drain is set to about 4.5 volts and bit line 1 connected to the source is set to about 0 volt to create a lateral electric field. Hot electrons from the source are injected into the lower portion of the charge accumulation layer of memory cell 1.

In a reading operation, to access data stored in bit 0 of memory cell 1 in cell string 0, the gate of even-string select transistors are set to about 4.5 volts and the gate of odd-string select transistors are set to about 0 volt to select cell string 0. Word line 1 connected to control gate 1 is set to about 1.5 volts and all other word lines are set to about 4.5 volts to select memory cell 1. Bit line 0 connected to the source is set to about 0 volt and bit line 1 connected to the drain is set to about 1.5 volts. The P-well layer of the substrate is set to about 0 volt. If charges are stored at the upper side (bit 0) of memory cell 1, the threshold voltage of the control gate 1 is changed accordingly and the current flowing through corresponding channel region to a sense amplifier is affected. Thus, whether certain amount of charges are stored in one side of the charge accumulation layer can be detected from the current flowing through the sense amplifier.

Figure 5A:
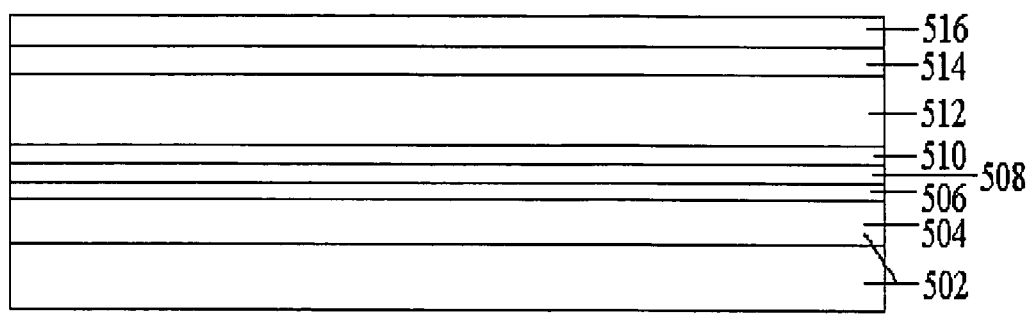
FIGS. 5A-5L are cross sectional diagrams of a NAND non-volatile two-bit memory array in various fabrication stages.

FIGS. 5A–5L illustrate an exemplary fabrication process of a NAND non-volatile two-bit memory array. In FIG. 5A, a mono-crystalline silicon substrate 502 has a P-well active layer 504. An oxide layer 506 with a thickness of about 30-50 angstroms is thermally grown on the substrate as a first dielectric layer. The oxide layer 506 functions as a gate oxide or tunnel oxide. A silicon nitride layer 508 with a thickness of about 60-80 angstroms is deposited by low pressure chemical vapor deposition (LPVCD) on the oxide layer 506 as a charge accumulation layer. A silicon dioxide layer 510 with a thickness of about 20-40 angstroms is deposited on the silicon nitride layer as a second dielectric layer. A polysilicon layer 512 with a thickness of about 1000 angstroms is deposited on the silicon oxide layer 510 as a control gate. The polysilicon layer 512 can be doped with N type irons or P type ions. An N type polysilicon is typically doped with phosphorus. A tungsten silicide layer 514 with a thickness of about 300 angstroms is deposited on the polysilicon layer 512 to lower the impedance of connected word line. A silicon nitride layer 516 with a thickness of about 200 angstroms is deposited on the tungsten silicide layer 514. During the subsequent etching process, the silicon nitride layer 516 can serve as a mask to prevent the polysilicon layer 512 in control gate area from being etched away.

Figure 5B:
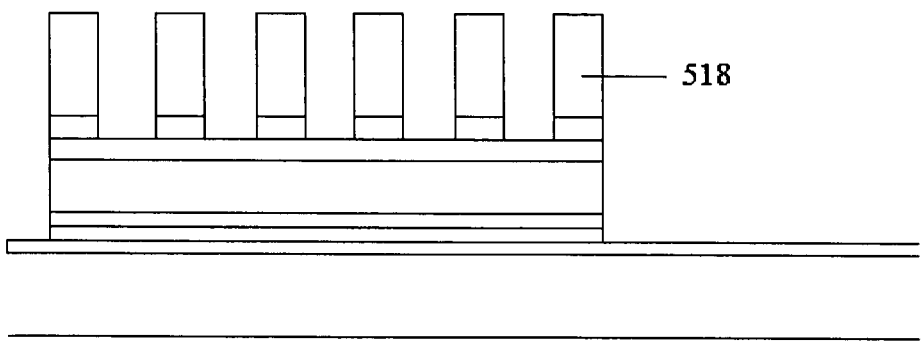
Figure 5C:
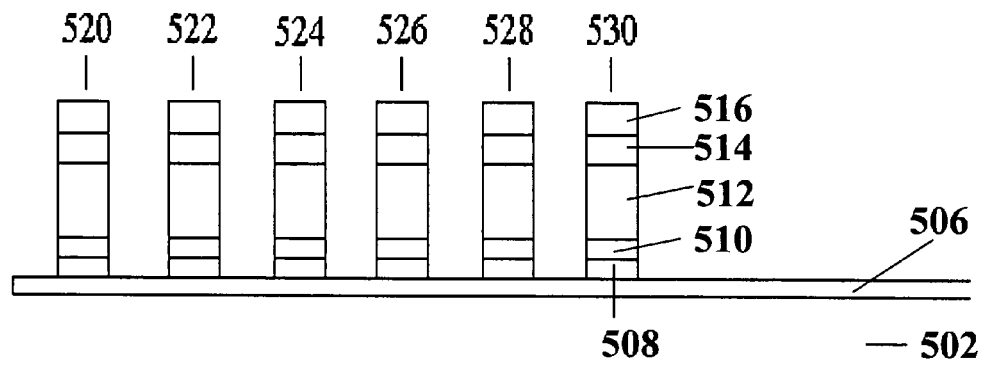

In FIG. 5B, a photoresist layer 518 is formed on the silicon nitride layer 516 and is subsequently patterned using conventional photolithographic processes to define both the control gate and the charge accumulation layer. The exposed portion of the silicon nitride layer 516 is then etched away by a dry etch. The remaining photoresist layer is then removed. In FIG. 5C, the remaining portion of the silicon nitride layer 516 serves as a mask to etch the tungsten silicide layer 514, the polysilicon layer 512, the silicon dioxide layer 510, and the silicon nitride layer 508 by an anisotropic dry etch to form the control gate and the charge accumulation layer. Cell stacks 520-530 with self aligned control gates and charge accumulation layers are formed.

Figure 5D:
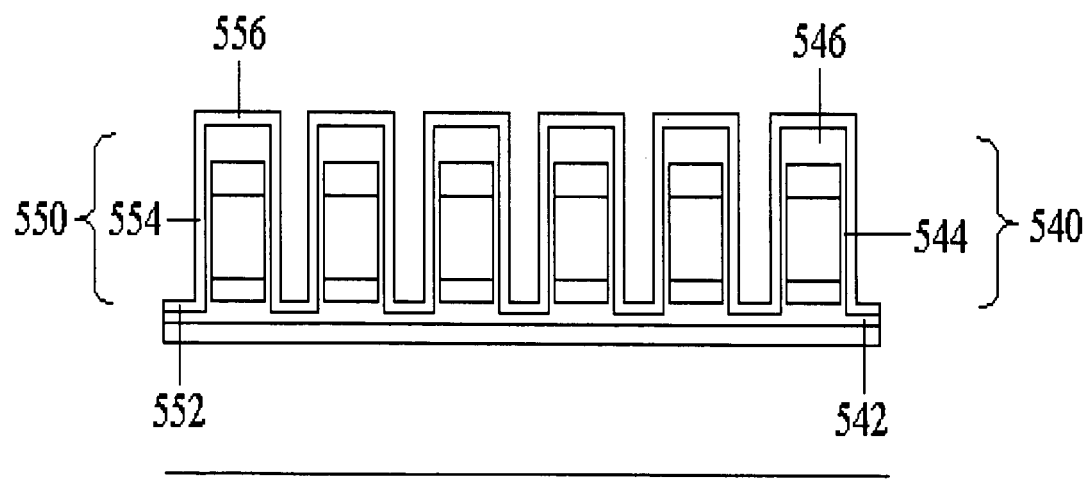
Figure 5E:
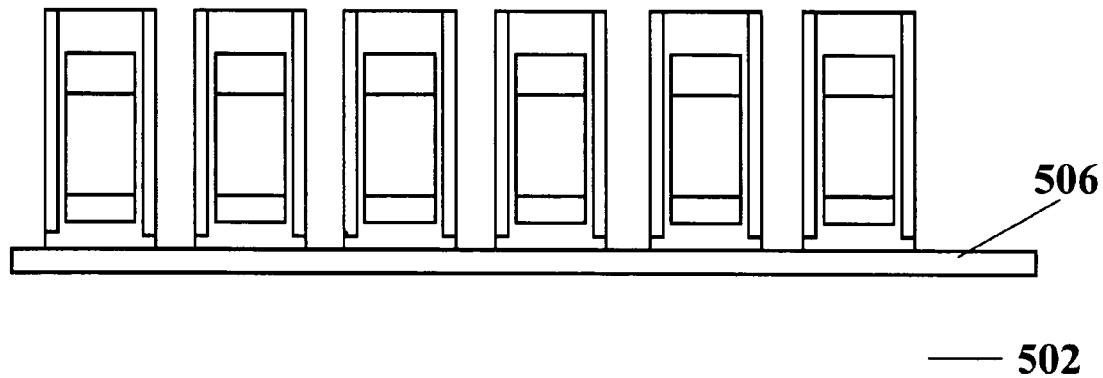

In FIG. 5D, a silicon nitride layer 540, including bottom portion 542, side portion 544 and top portion 546, with a thickness of about 30 angstroms is deposited by LPCVD on a portion of the oxide layer 506 between cell stacks and on the sides and the top of cell stacks. A silicon dioxide layer 550, including a bottom portion 552, a side portion 554 and a top portion 556, with a thickness of about 150 angstroms is deposited by LPCVD on the silicon nitride layer 540. In FIG. 5E, the bottom portion 552 and the top portion 556 of the silicon dioxide layer 550 are etched away by an anisotropic dry etch. The bottom portion 542 and the top portion 546 of the silicon nitride layer 540 are further etched away by an anisotropic dry etch. Two-layer side walls with the side portion 544 of the silicon nitride layer 540 as an inner layer and the side portion 554 of the silicon dioxide layer 550 as an outer layer are formed. The silicon nitride layer 540 can prevent the control gates from being oxidized while forming the silicon dioxide layer 550. As a result, select gates between the cell stack can be made wider and have smaller resistance.

Figure 5F:
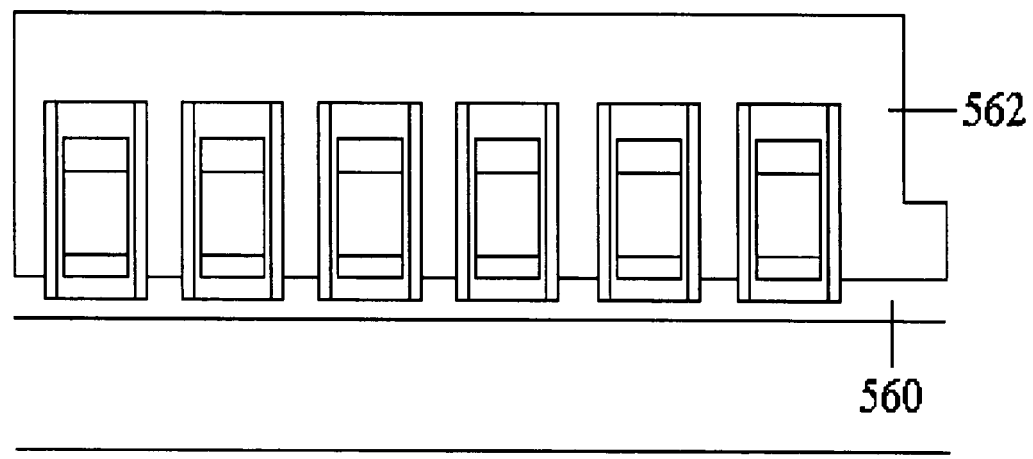
Figure 5G:
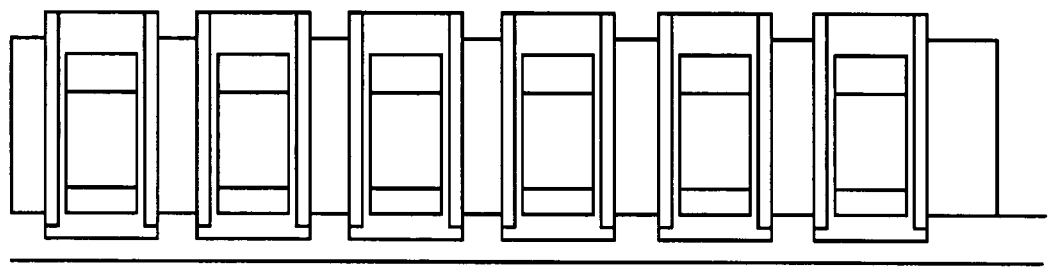
Figure 5H:
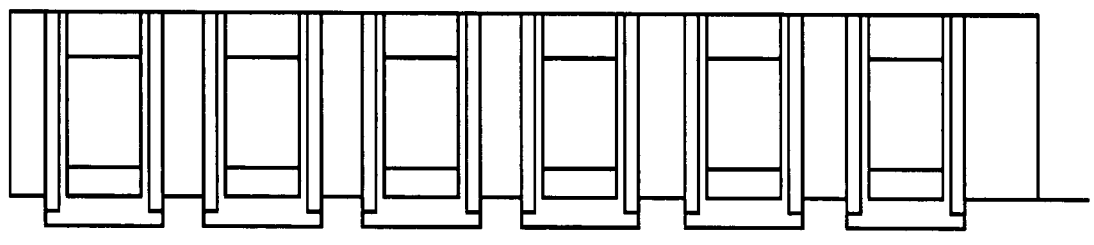

In FIG. 5F, the 506 silicon dioxide layer outside the cell stack is etched first and then a silicon dioxide layer 560 with a thickness of about 140 angstroms is deposited by LPCVD on a portion of the oxide layer 506 between cell stacks. A thick polysilicon layer 562 is deposited up to a level higher than the silicon nitride layer 516 for use as select gates. In FIG. 5G, the polysilicon layer 562 is etched back to a level slightly lower than the top of silicon nitride layer 516. In FIG. 5H, a chemical mechanical polish (CMP) is applied to bring a flat top surface down to the level of tungsten silicide layer 514. As a result, the remaining portion of the silicon nitride layer 516 and certain amount of the polysilicon layer 562 are removed.

Figure 5I:
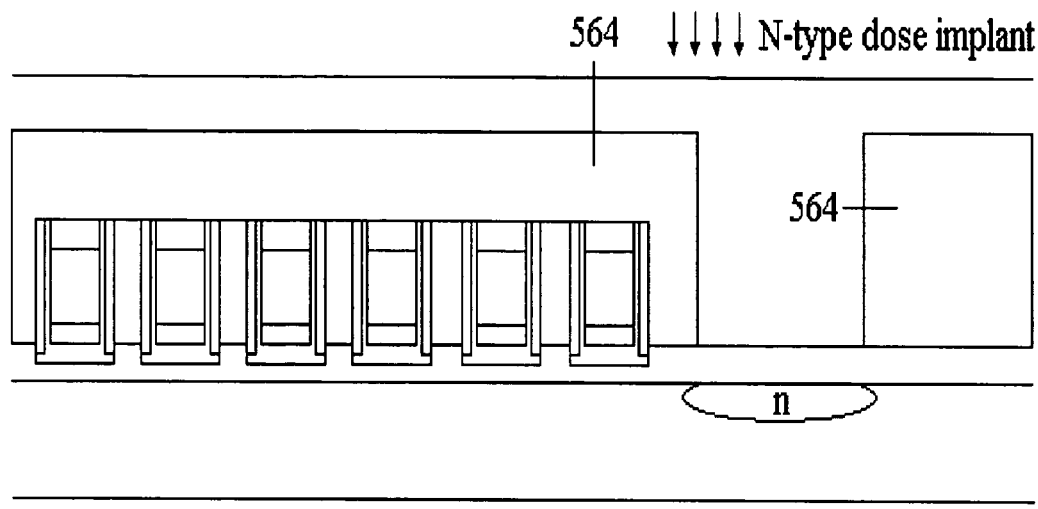
Figure 5J:
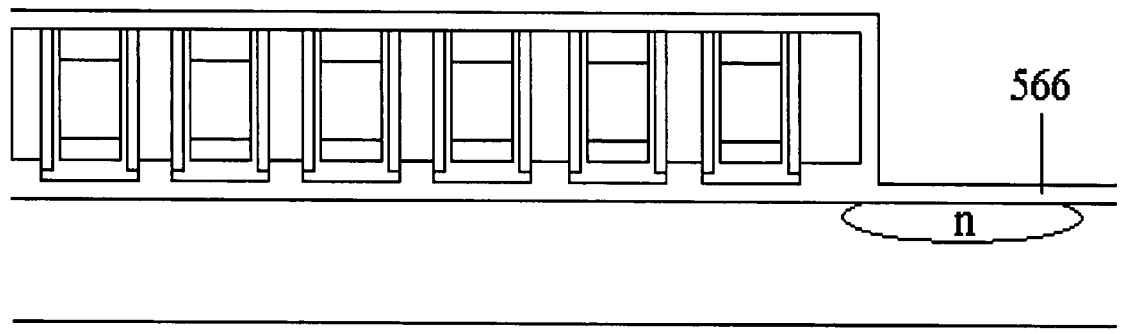
Figure 5K:
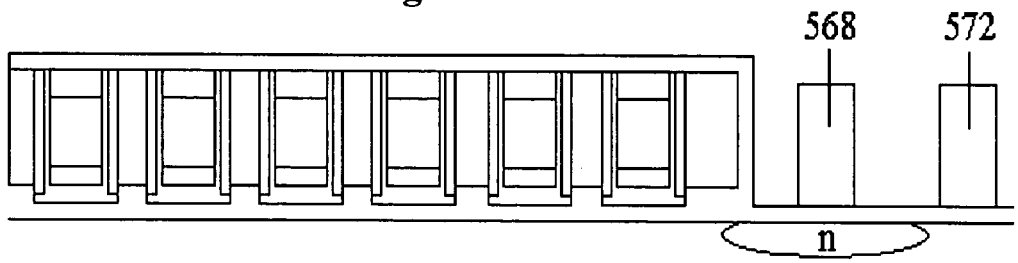
Figure 5K:
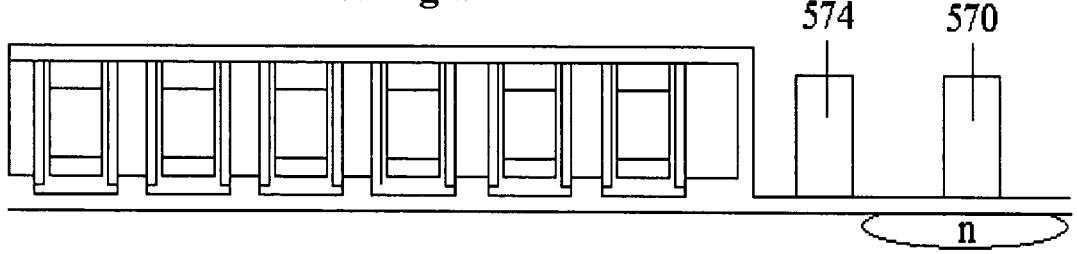
Figure 5L:
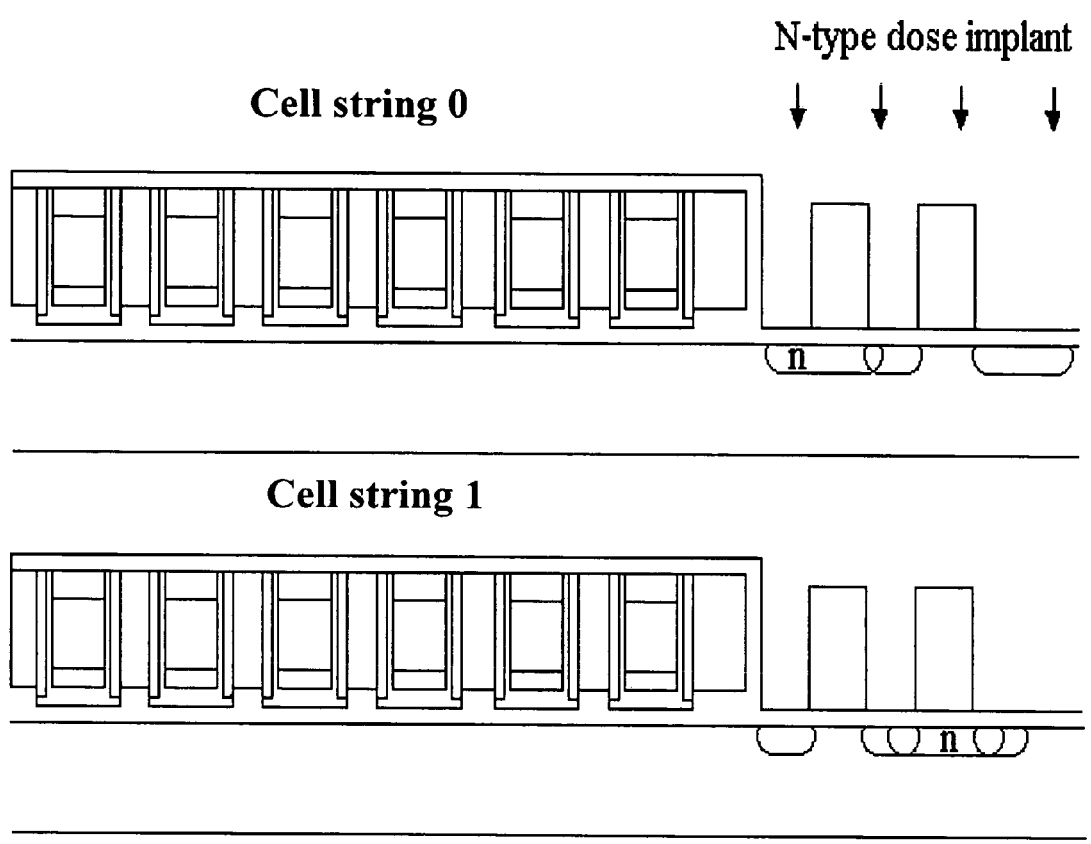

In FIG. 5I, a photoresist layer 564 is formed on the top surface and is patterned to expose the area for the depletion mode transistor. N type ions, such as arsenic, are implanted into the channel region that will be under the gate of depletion mode transistor to assure that the depletion mode transistor is always conductive. The remaining of the photoresist layer 564 is then removed. In FIG. 5J, the original oxide layer 560 over the area for depletion mode transistors, even-string select transistors and odd-string select transistors are removed by etching. A new silicon dioxide layer 566 with a thickness of about 200 angstroms is thermally grown on the top surface as a gate oxide for depletion mode transistors, even-string select transistors and odd-string select transistors. In FIG. 5K, a polysilicon layer with a thickness of about 1000 angstroms is deposited and patterned to form gates of depletion mode transistors 568, 570 and gates of even-string select transistors and odd-string select transistors 572, 574. In FIG. 5L, N type ions, such as arsenic, are implanted to form sources and drains of the even-string select transistors 572 and the odd-string select transistors 574.

Although the invention has been described in terms of exemplary embodiments, it is not limited thereto. The described embodiment is to be considered in all respects only as illustrative and not as restrictive. The present invention may be embodied in other specific forms without departing from its essential characteristics. The scope of the invention, therefore, is indicated by the appended claims rather than by the foregoing description. All changes, which come within the meaning and range of the equivalents of the claims, are to be embraced within their scope.

I claim:

1. A NAND non-volatile two-bit memory cell comprising:
   a cell stack and two select stacks disposed on an active area of a substrate, each select stack respectively disposed on a side of the cell stack with a sidewall between the cell stack and a respective select stack;
   wherein the cell stack comprises a first dielectric layer disposed over the substrate, a charge accumulation layer holding charge in a portion thereof to store information disposed over the first dielectric layer, a second dielectric layer disposed over the charge accumulation layer and a control gate disposed over the second dielectric layer, and the select stack comprises a third dielectric layer disposed over the substrate and a select gate disposed over the third dielectric layer,
   wherein the memory cell has a first state having no source or drain region, and a second state that the select gate inverts an underneath channel region in the active area to function as a source or a drain of the memory cell.

2. The memory cell of claim 1, wherein the memory cell is programmed by source side injection of electrons.

3. The memory cell of claim 1, wherein the charge accumulation layer comprises a nonconductive material.

4. The memory cell of claim 1, wherein the charge accumulation layer comprises silicon nitride whose thickness is approximately 60-80 angstroms.

5. The memory cell of claim 1, wherein each side of the charge accumulation layer can separately retain charge to store one bit of information.

6. The memory cell of claim 1, wherein the select gate comprises polysilicon.

7. The memory cell of claim 1, wherein the side wall comprises an inner layer of silicon nitride and an outer layer of silicon dioxide.

8. A NAND non-volatile two-bit memory cell array comprising:
   a plurality of memory cells arranged in rows and columns, the memory cells in the same column connected in a series to form a cell string;
   a plurality of select transistors, each end of the cell string respectively connected to one select transistor; and
   a plurality of bit line pairs, each bit line pair including an even bit line and an odd bit line, the even bit line connected to both select transistors disposed at one end of two adjoining cell strings, the odd bit line connected to both select transistors disposed at an opposite end of the same two adjoining cell strings;
   wherein the memory cell comprises a cell stack and two select stacks disposed on a substrate, the select stacks respectively disposed on each side of the cell stack with a sidewall between the cell stack and a respective select stack, a select stack disposed between two cell stacks being shared by two adjoining memory cell, the cell stack comprising a first dielectric layer disposed over the substrate, a charge accumulation layer holding charge in a portion thereof to store information disposed over the first dielectric layer, a second dielectric layer disposed over the charge accumulation layer and a control gate disposed over the second dielectric layer, the select stack comprising a third dielectric layer disposed over the substrate and a select gate disposed over the third dielectric layer,
   wherein the memory cell has a first state having no source or drain region, and a second state that the select gate inverts an underneath channel region to function as a source or a drain of the memory cell.

9. The memory cell array of claim 8, wherein electrons are injected into a portion of the charge accumulation layer by source side injection during a programming operation.

10. The memory cell array of claim 8, wherein the charge accumulation layer comprises a nonconductive material.

11. The memory cell array of claim 8, wherein the charge accumulation layer comprises silicon nitride whose thickness is approximately 60-80 angstroms.

12. The memory cell array of claim 8, wherein each side of the charge accumulation layer can separately retain charge to store one bit of information.

13. The memory cell array of claim 8, wherein the side wall comprises an inner layer of silicon nitride and an outer layer of silicon dioxide.

14. The memory array of claim 8, wherein a selected side of a selected memory cell in a selected cell string is programmed by applying a voltage of approximately 9V to the control gate of the selected cell memory, applying a voltage of approximately 1.5V to the select gate at the selected side, applying a voltage of approximately 7V to other control gates and select gates, and applying a voltage difference of approximately 4.5V across two ends of the selected cell string.

15. The memory cell array of claim 8, wherein each cell string has 16, 32 or 64 memory cells.

16. The memory cell array of claim 8 further comprising a plurality of depletion mode transistors.

* * * * *